(12) United States Patent
Shin et al.

(10) Patent No.: US 12,144,225 B2
(45) Date of Patent: Nov. 12, 2024

(54) DISPLAY DEVICE INCLUDING COLOR FILTER LAYER

(71) Applicant: LG DISPLAY CO., LTD., Seoul (KR)

(72) Inventors: Youngsub Shin, Goyang-si (KR); Daeheung Lee, Paju-si (KR); Byonghoo Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 464 days.

(21) Appl. No.: 17/515,853

(22) Filed: Nov. 1, 2021

(65) Prior Publication Data
US 2022/0199691 A1 Jun. 23, 2022

(30) Foreign Application Priority Data
Dec. 22, 2020 (KR) .................. 10-2020-0181150

(51) Int. Cl.
| | |
|---|---|
| *H01L 29/08* | (2006.01) |
| *G06F 3/044* | (2006.01) |
| *H10K 50/84* | (2023.01) |
| *H10K 50/86* | (2023.01) |
| *H10K 59/122* | (2023.01) |
| *H10K 59/38* | (2023.01) |
| *H10K 59/40* | (2023.01) |

(52) U.S. Cl.
CPC .......... *H10K 59/38* (2023.02); *G06F 3/0448* (2019.05); *H10K 50/84* (2023.02); *H10K 50/865* (2023.02); *H10K 59/122* (2023.02); *H10K 59/40* (2023.02); *G06F 2203/04112* (2013.01)

(58) Field of Classification Search
CPC ...... H10K 59/38; H10K 59/40; H10K 59/122; H10K 50/84; H10K 50/865; G06F 3/0448; G06F 2203/4112
USPC .......................................................... 257/40
See application file for complete search history.

(56) References Cited

U.S. PATENT DOCUMENTS

| | | |
|---|---|---|
| 9,435,916 B2 | 9/2016 | David et al. |
| 9,939,557 B2 | 4/2018 | David et al. |

(Continued)

FOREIGN PATENT DOCUMENTS

| | | | | |
|---|---|---|---|---|
| CN | 107863505 B | * | 10/2021 | ........ H01M 10/0525 |
| JP | 2010264757 A | * | 11/2010 | ........... G09F 3/0297 |

(Continued)

*Primary Examiner* — Phuc T Dang
(74) *Attorney, Agent, or Firm* — Morgan, Lewis & Bockius LLP

(57) ABSTRACT

Disclosed is a display device capable of suppressing a rainbow mura defect. The display device includes a base substrate including a display area and a non-display area; a plurality of organic light-emitting elements disposed in the display area; an encapsulation layer disposed to cover the plurality of organic light-emitting elements; a mesh-shaped touch electrode disposed on the encapsulation layer, wherein the touch electrode has a plurality of openings defined therein; a color filter layer disposed on the touch electrode, wherein the color filter layer includes: a plurality of color filters arranged to respectively correspond to the plurality of openings of the touch electrode; and a black matrix disposed to correspond to the touch electrode; and a planarization layer disposed on the color filter layer, wherein the planarization layer contains a matrix resin, and inorganic nanotubes irregularly dispersed in the matrix resin.

20 Claims, 10 Drawing Sheets

(56) References Cited

U.S. PATENT DOCUMENTS

| | | | | |
|---|---|---|---|---|
| 2015/0153488 A1* | 6/2015 | Zhang | ............... | G02F 1/133516 |
| | | | | 359/891 |
| 2019/0214440 A1* | 7/2019 | Lee | ......................... | G06F 3/044 |
| 2019/0245017 A1* | 8/2019 | Jeon | ..................... | H10K 59/352 |
| 2020/0167037 A1* | 5/2020 | Lee | ....................... | H10K 59/40 |

FOREIGN PATENT DOCUMENTS

| | | | | | |
|---|---|---|---|---|---|
| KR | 10-1915868 B1 | | 11/2018 | | |
| KR | 20210149280 A | * | 12/2021 | ........... | H10K 59/122 |
| WO | WO-2010004865 A1 | * | 1/2010 | ........... | H01L 27/322 |

* cited by examiner

DISPLAY DEVICE INCLUDING COLOR FILTER LAYER

CROSS-REFERENCE TO RELATED APPLICATION

This application claims a benefit under 35 U.S.C. § 119(a) of Korean Patent Application No. 10-2020-0181150 filed on Dec. 22, 2020, on the Korean Intellectual Property Office, the entirety of disclosure of which is incorporated herein by reference for all purposes.

BACKGROUND

Technical Field

The present disclosure relates to a display device.

Discussion of the Related Art

With the development of display device technology, display devices using various schemes have been developed, such as liquid crystal display devices (LCD), organic light-emitting display devices (OLED), and the like.

Mobile display devices such as smart phones, tablet PCs, etc., display devices used for transportations such as cars or airplanes, and commercial display devices used in outdoor events or public places, etc. may have decrease in visibility of a display screen due to reflection of external light therefrom.

In order to solve the deterioration in the visibility due to the reflection of external light, a scheme in which a display device includes a polarizing plate outside a substrate in an emission direction of light has been proposed. However, when using the polarizing plate, a portion of light generated from light emitting elements in the display device is blocked with the polarizing plate, such that luminance is deteriorated.

SUMMARY

Therefore, it is necessary to solve the deterioration of the visibility due to reflection of the external light without having the polarizing plate. In one example, a display device has been proposed in which a color filter layer including a red color filter, a green color filter, and a blue color filter distinguished from each other by a black matrix is applied on an encapsulation layer covering the light-emitting elements.

In the display device to which the color filter layer is applied, the external light reflection may be reduced without having the polarizing plate. However, there is a problem that a rainbow mura defect may occur due to diffraction of the external light, diffraction of internal reflected light, and interference thereof due to the color filter layer.

Accordingly, embodiments of the present disclosure are directed to a display device that substantially obviates one or more of the problems due to limitations and disadvantages of the related art.

An aspect of the present disclosure is to provide a display device capable of suppressing the rainbow mura defect while reducing reflection of external light without having a polarizing plate.

Another aspect of the present disclosure is to provide a display device capable of suppressing the rainbow mura defect as well as the external light reflection.

Further, an aspect of the present disclosure is to provide a display device capable of suppressing the rainbow mura defect while reducing a reflectance without loss of a transmittance.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display device comprises a plurality of organic light-emitting elements disposed on a display area of a substrate, a mesh-shaped touch electrode disposed on an encapsulation layer covering the plurality of organic light-emitting elements, and a color filter layer including a plurality of color filters disposed to respectively correspond to openings of the touch electrode and a black matrix positioned to correspond to the touch electrode.

The display device according to one embodiment of the present disclosure further includes a planarization layer disposed on the color filter layer, and made of a matrix resin containing inorganic nano-tubes irregularly dispersed therein. Thus, the rainbow mura defect may be suppressed.

The display device according to one embodiment of the present disclosure further includes a plurality of planarization layers locally arranged respectively to correspond to the plurality of color filters, wherein each planarization layer is made of a matrix resin containing inorganic nano-tubes irregularly dispersed therein. Thus, the rainbow mura defect may be suppressed.

According to the embodiment of the present disclosure, due to the planarization layer made of the matrix resin containing the inorganic nano-tubes irregularly dispersed therein, the rainbow mura defect may be suppressed.

Further, according to the embodiment of the present disclosure, the reflectance may be reduced without loss of the transmittance.

It is to be understood that both the foregoing general description and the following detailed description are exemplary and explanatory and are intended to provide further explanation of the inventive concepts as claimed.

BRIEF DESCRIPTION OF DRAWINGS

The accompanying drawings, which are included to provide a further understanding of the disclosure and are incorporated in and constitute a part of this application, illustrate embodiments of the disclosure and together with the description serve to explain various principles.

DETAILED DESCRIPTION

Figure 1:
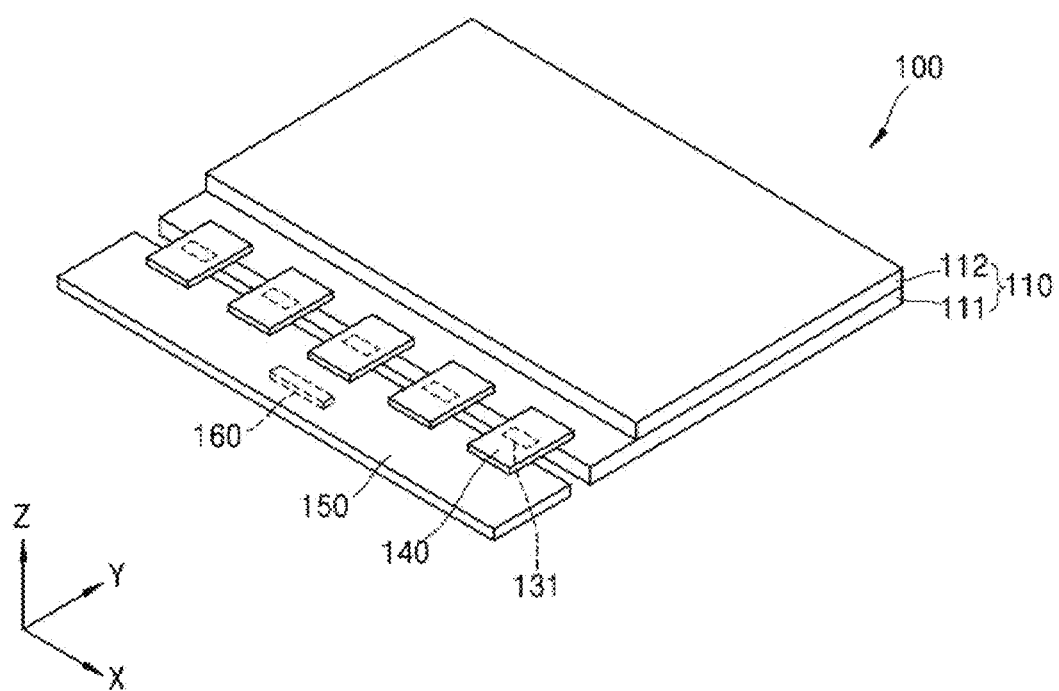
FIG. 1 is a perspective view of a display device according to one embodiment of the present disclosure.

Advantages and features of the present disclosure, and a method of achieving the Advantages and features will become apparent with reference to embodiments described later in detail together with the accompanying drawings. However, the present disclosure is not limited to the embodiments as disclosed below, but may be implemented in various different forms. Thus, these embodiments are set forth only to make the present disclosure complete, and to completely inform the scope of the disclosure to those of ordinary skill in the technical field to which the present disclosure belongs, and the present disclosure is only defined by the scope of the claims.

A shape, a size, a ratio, an angle, a number, etc. disclosed in the drawings for describing the embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is indicated.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, display devices according to some embodiments of the present disclosure will be described.

Figure 2:
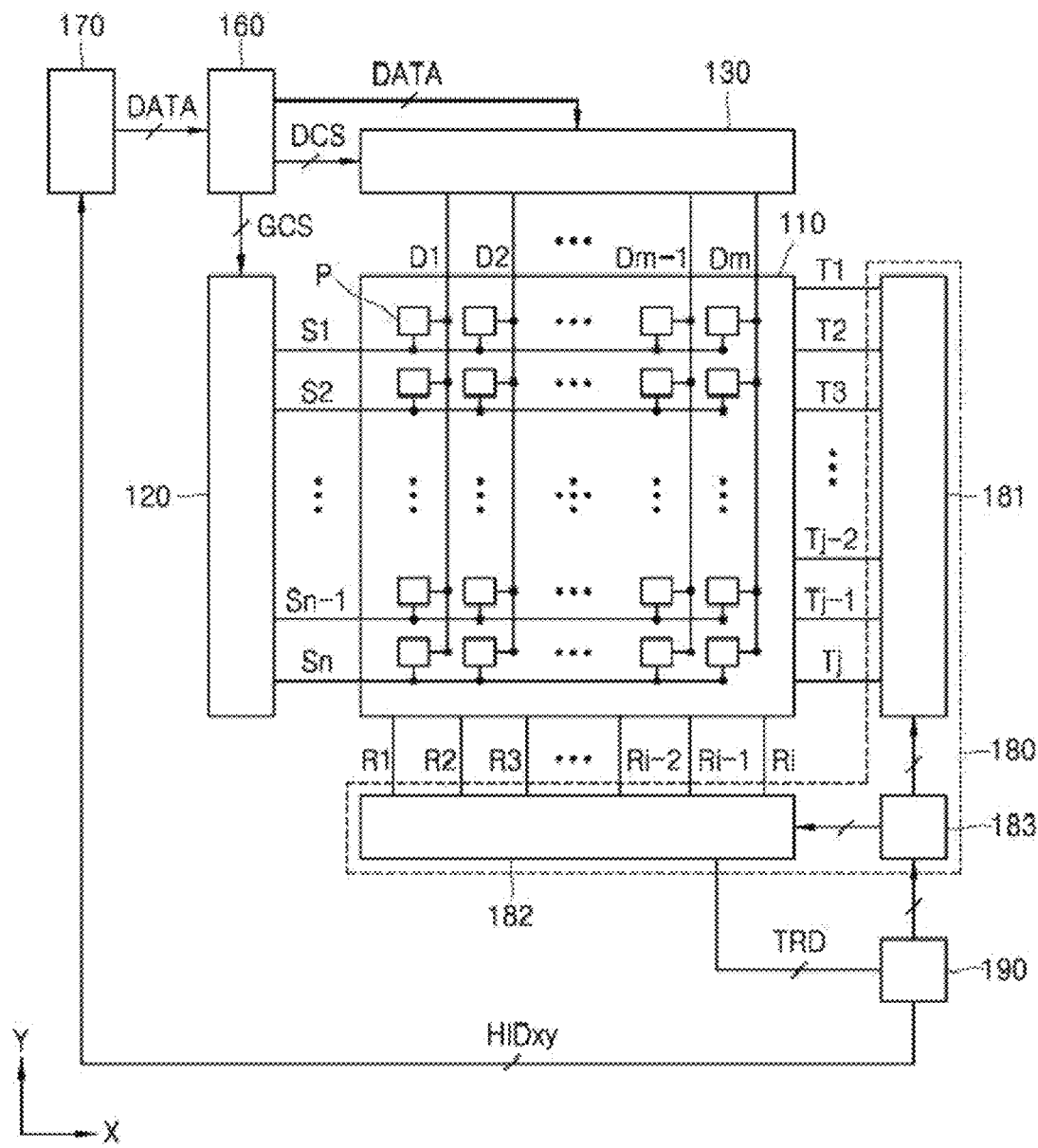
FIG. 2 is a block diagram of a display device according to one embodiment of the present disclosure.
Figure 3:
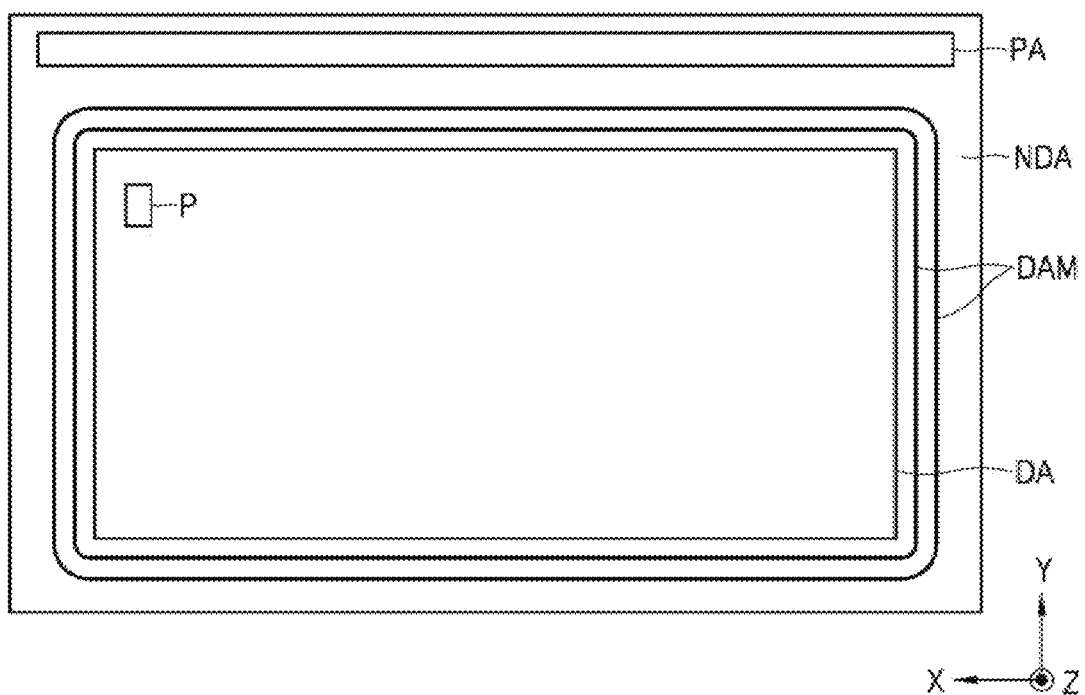
FIG. 3 is a schematic plan view of a first substrate according to one embodiment of the present disclosure.

Referring to FIG. 1 and FIG. 2, a display device 100 according to one embodiment of the present disclosure includes a display panel 110, a scan driver 120, a data driver 130, a timing controller 160, a host system 170, a touch driver 180 and a touch coordinate calculator 190.

In the present disclosure, a case that the display device is implemented as an organic light-emitting display device (OLED) will be described by way of example. The present disclosure is not limited thereto. The display device may be implemented as various flat panel display devices such as a liquid crystal display device (LCD).

The display panel 110 includes a display area for displaying an image. The display area includes a plurality of pixels P. On the display panel 110, data lines D1 to Dm (m are positive integers of 2 or greater), scan lines S1 to Sn (n are positive integers of 2 or greater) are formed. The data lines D1 to Dm may intersect the scan lines S1 to Sn. The scan line may be embodied as a gate line. The pixels P may be respectively formed in areas defined by intersections of the scan lines and the data lines.

Each pixel P of the display panel 110 may be connected to one of the data lines D1 to Dm and one of the scan lines S1 to Sn.

Each pixel P of the display panel 110 may include a driving transistor that adjusts a current between a drain and a source thereof according to a data voltage applied to a gate electrode thereof, a scan transistor which is turned on by a scan signal of the scan line to supply a data voltage of the data line to the gate electrode of the driving transistor, an organic light-emitting diode that emits light according to the current between the drain and the source of the driving transistor, and a capacitor for storing a voltage of the gate electrode of the driving transistor. Thus, each pixel P may emit light according to the current supplied to the organic light-emitting diode.

The scan driver 120 receives a scan control signal GCS from the timing controller 160. The scan driver 120 supplies scan signals to the scan lines S1 to Sn according to the scan control signal GCS.

The scan driver 120 may be formed in a non-display area on one side or both sides of the display area of the display panel 110 in a GIP (gate driver in panel) scheme. Alternatively, the scan driver 120 may be manufactured as a driving chip which may be mounted on a flexible film which may be attached to the non-display area on one side or both sides of the display area of the display panel 110 using a TAB (tape automated bonding) scheme.

The data driver 130 receives digital video data and a data control signal DCS from the timing controller 160. The data driver 130 converts the digital video data into an analog positive/negative data voltage according to the data control signal DCS and supplies the converted voltage to the data lines. That is, pixels to be supplied with the data voltage are selected based on the scan signals of the scan driver 120, and the data voltages are supplied to the selected pixels.

As shown in FIG. 1, the data driver 130 may include a plurality of source drive ICs 131. Each of the plurality of source drive ICs 131 may be mounted on a flexible film 140 using a COF (chip on film) or a COP (chip on plastic) scheme. The flexible film 140 may be attached on pads prepared in the non-display area of the display panel 110 using an anisotropic conductive film. Accordingly, the plurality of source drive ICs 131 may be respectively connected to the pads.

The circuit board 150 may be attached to the flexible film 140. A number of circuits implemented as driving chips may be mounted on the circuit board 150. For example, the timing controller 160 may be mounted on the circuit board 150. The circuit board 150 may be embodied as a printed circuit board or a flexible printed circuit board.

The timing controller 160 receives the digital video data and timing signals from the host system 170. The timing signals may include a vertical synchronization signal, a horizontal synchronization signal, a data enable signal, and a dot clock signal. The vertical synchronization signal refers to a signal defining one frame period. The horizontal synchronization signal refers to a signal that defines one horizontal period required to supply data voltages to pixels of a single horizontal line of the display panel DIS. The data enable signal refers to a signal that defines a period for which valid data is input. The dot clock signal refers a signal that is repeated at a predefined short cycle The timing controller 160 is used to control operation timings of the scan driver 120 and the data driver 130. To this end, the timing controller 160 may generate a data control signal DCS to control the operation timing of the data driver 130, and a scan control signal GCS to control the operation timing of the scan driver 120, based on the timing signals. The timing controller 160 outputs the scan control signal GCS to the scan driver 120, and outputs the digital video data and the data control signal DCS to the data driver 130.

The host system 170 may be implemented as a navigation system, a set-top box, a DVD player, a Blu-ray player, a personal computer (PC), a home theater system, a broadcast receiver, and a phone system. The host system 170 includes a SoC (System on chip) having a built-in scaler to convert the digital video data of an input image into a format suitable for display on the display panel 110. The host system 170 transmits the digital video data and the timing signals to the timing controller 160.

In addition to the data lines D1 to Dm and the scan lines S1 to Sn, first and second touch electrodes may be formed on the display panel 110. The first touch electrodes may intersect with the second touch electrodes. The first touch electrodes may be connected to a first touch driver 181 via first touch lines T1 to Tj (j is a positive integer greater than or equal to 2). The second touch electrodes may be connected to a second touch driver 182 via a second touch lines R1 to Ri (i is a positive integer greater than or equal to 2). A touch sensor may be formed at each of the intersections between the first and second touch electrodes. In an embodiment of the present disclosure, it is illustrated that the touch sensor is implemented based on mutual capacitance. The present disclosure is not limited thereto.

The touch driver 180 supplies a drive pulse to the first touch electrodes via the first touch lines T1 to Tj and senses a charge variation of each of the touch sensors via the second touch lines R1 to Ri. Referring to FIG. 2, a case in which the first touch lines T1 to Tj are embodied as Tx lines for supplying the drive pulse, and the second touch lines R1 to Ri are embodied as Rx lines for sensing the charge variation of each touch sensor is described by way of example. However, the present disclosure is not limited thereto.

The touch driver 180 includes the first touch driver 181, the second touch driver 182, and a touch controller 183. The first touch driver 181, the second touch driver 182, and the touch controller 183 may be integrated into one ROIC (Read-out IC).

The first touch driver 181 selects a first touch line to output the drive pulse under control of the touch controller 183, and supplies the drive pulse to the selected first touch line. For example, the first touch driver 181 may sequentially supply the drive pulses to the first touch lines T1 to Tj.

The second touch driver 182 selects the second touch lines to receive the charge variations of the touch sensors under the control of the touch controller 183, and receives the charge variations of the touch sensors via the selected second touch lines. The second touch driver 182 samples the charge variations of the touch sensors received via the second touch lines R1 to Ri and converts the sampled charge variations into touch raw data (TRD) as digital data.

The touch controller 183 may generate a Tx setup signal to set the first touch line when the drive pulse is output from the first touch driver 181 and an Rx setup signal to set the second touch line when the second touch driver 182 receives a touch sensor voltage. Further, the touch controller 183 generates timing control signals to control operation timings of the first touch driver 181 and the second touch driver 182.

The touch coordinate calculator 190 receives the touch row data TRD from the touch driver 180. The touch coordinate calculator 190 calculates a touch coordinate(s) according to a touch coordinate calculation method, and outputs touch coordinate data HIDxy including information about the touch coordinate(s) to the host system 170.

The touch coordinate calculator 190 may be implemented using a MCU (Micro Controller Unit). The host system 170 analyzes the touch coordinate data HIDxy input from the touch coordinate calculator 190 and executes an application program linked to the coordinate that the user has touched. The host system 170 transmits the digital video data and the timing signals to the timing controller 160 according to the executed application program.

The touch driver 180 may be included in the source drive IC 131 or may be manufactured as a separate driving chip which in turn may be mounted on the circuit board 150. Further, the touch coordinate calculator 190 may be manufactured as a driving chip which may be mounted on the circuit board 150.

The display panel 110 includes a first substrate 111, a second substrate 112a, and a thin-film transistor layer, an organic light-emitting element layer, an encapsulation layer, a touch sensing layer, a color filter layer, and a planarization layer disposed between the first and second substrates 111 and 112.

The first substrate 111 may be embodied as a glass substrate or a plastic substrate.

The thin-film transistor layer may be formed on the first substrate 111. The thin-film transistor layer may include scan lines, data lines, and thin-film transistors. Each of the thin-film transistors includes a gate electrode, a semiconductor layer, a source electrode, and a drain electrode. When the scan driver is formed in the GIP (gate driver in panel) scheme, the scan driver may be formed together with the thin-film transistor layer.

The light-emitting element layer may be formed on the thin-film transistor layer. In the present disclosure, an example in which the light-emitting element layer is embodied as an organic light-emitting element layer that uses a light-emitting element as an organic light-emitting element is described. The present disclosure is not limited thereto. The organic light-emitting element layer includes a first electrode, an organic light-emitting layer, a second electrode, and banks.

Each of the organic light-emitting layers may include a hole transporting layer, a light-emitting layer, and an electron transporting layer. In this case, when a voltage is applied across the first electrode and the second electrode, holes and electrons are moved to the light-emitting layer via the hole transport layer and the electron transport layer, respectively, and are combined with each other in the light-emitting layer to emit light. Since pixels are provided in an area where the organic light-emitting element layer is formed, the area where the organic light-emitting element layer is formed may be defined as the display area. a peripheral area around the display area may be defined as the non-display area.

The encapsulation layer is formed on the organic light-emitting element layer. The encapsulation layer serves to prevent the penetration of oxygen or moisture into the organic light-emitting element layer. The encapsulation layer may include at least one organic encapsulation film.

The touch sensing layer is formed on the encapsulation layer. The touch sensing layer includes first touch electrodes and second touch electrodes for sensing a user's touch. The touch sensing layer may include bridge electrodes electrically connecting the first touch electrodes to each other or electrically connecting the second touch electrodes to each other.

The color filter layer including red, green, and blue color filters is formed on the touch sensing layer.

On the color filter layer, the planarization layer containing inorganic nano-tubes irregularly dispersed therein is formed.

The second substrate 112 may be embodied as a plastic film, a glass substrate, or an encapsulating film protective film. In some cases, the second substrate 112 may be omitted.

Hereinafter, a display device according to one embodiment of the present disclosure will be described in more detail with reference to FIG. 3 to FIG. 7.

The first substrate 111 may be named a base substrate, and may include a display area DA and a non-display area NDA.

As described above, the first substrate 111 may be embodied as the glass substrate, or as the plastic substrate made of a polyimide material having flexibility.

The non-display area NDA may include a pad area PA in which the pads PAD are formed, and a dam DAM. In this case, the dam DAM may include a plural of dams. Further, separate dams may be individually formed in different layers.

The thin-film transistor layer and the organic light-emitting element layer are formed in the display area DA of the first substrate 111.

The thin-film transistor layer includes a thin-film transistor 210, a gate insulating layer 220, an interlayer insulating layer 230, a protective layer 240, and a first planarization layer 250.

A buffer layer may be formed on one face of the first substrate 111. The buffer layer is formed on one face of the first substrate 111 to protect the thin-film transistor 210 and the organic light-emitting element 260 from moisture penetrating through the first substrate 111 vulnerable to moisture permeation. One face of the first substrate 111 may be a face facing toward the second substrate 112. The buffer layer may be composed of a plurality of inorganic layers as stacked alternately. For example, the buffer layer may be composed of multiple layers in which at least one inorganic film among a silicon oxide film $SiO_x$, a silicon nitride film $SiN_x$, and SiON is alternately stacked.

The thin-film transistor 210 is formed on the buffer layer. The thin-film transistor 210 includes an active layer 211, a gate electrode 212, a source electrode 213 and a drain electrode 214. In the present disclosure, it is illustrated that the thin-film transistor 210 is of a top gate type where the gate electrode 212 is located above the active layer 211. The present disclosure is not limited thereto. The thin-film transistor 210 may be of a bottom gate type or a double gate type.

The active layer 211 is formed on the buffer layer. The active layer 211 may be made of an oxide semiconductor material such as IGZO (Indium Gallium Zinc Oxide), but is not limited thereto. The active layer 211 may be made of low temperature polycrystalline silicon (LTPS) or amorphous silicon (a-Si).

A light-blocking layer may be formed between the buffer layer and the active layer 211 to prevent the external light from being incident on the active layer 211.

On the active layer 211, the gate insulating layer 220 that insulates the active layer 211 and the gate electrode 212 from each other may be formed. In the present disclosure, it is illustrated that the gate insulating layer 220 is formed over an entire first substrate 111. The present disclosure is not limited thereto. The gate insulating layer 220 may only be formed under the gate electrode 212. The gate insulating layer 220 may be composed of an inorganic material layer, for example, a silicon oxide film $SiO_x$, a silicon nitride film $SiN_x$, or multiple layers thereof.

The gate electrode 212 and a gate line may be formed on the gate insulating layer 220. Each of the gate electrode 212 and the gate line may be composed of a single layer or multiple layers, made of one of molybdenum (Mo), aluminum (Al), chromium (Cr), gold (Au), titanium (Ti), nickel (Ni), neodymium (Nd) and copper (Cu), or an alloy thereof.

The interlayer insulating layer 230 may be formed on the gate electrode 212 and the gate line. The interlayer insulating layer 230 may be composed of an inorganic film, for example, a silicon oxide film $SiO_x$, a silicon nitride film $SiN_x$, or multiple layers thereof.

The source electrode 213, the drain electrode 214, and the data line may be formed on the interlayer insulating layer 230. Each of the source electrode 213 and the drain electrode 214 may be connected to the active layer 211 via each contact hole extending through the gate insulating layer 220 and the interlayer insulating layer 230. Each of the source electrode 213, the drain electrode 214 and the data line may be composed of a single layer or multiple layers, made of one of molybdenum (Mo), aluminum (Al), chromium (Cr), gold (Au), titanium (Ti), nickel (Ni), neodymium (Nd) and copper (Cu), or an alloy thereof.

The protective layer 240 to insulate the thin-film transistor 210 may be formed on the source electrode 213, the drain electrode 214 and the data line. The protective layer 240 may be composed of an inorganic film, for example, a silicon oxide film $SiO_x$, a silicon nitride film $SiN_x$, or a multilayer thereof.

On the protective layer 240, the first planarization layer 250 that flattens a step due to the thin-film transistor 210 may be formed. The first planarization layer 250 may be composed of an organic film made of acrylic resin, epoxy resin, phenolic resin, polyamide resin, and polyimide resin.

On the thin-film transistor layer, the organic light-emitting element layer is formed. The organic light-emitting element layer includes organic light-emitting elements 260 and a bank layer 270.

That is, a plurality of light-emitting elements are arranged in the display area DA. In the present disclosure, a case in which the light-emitting element is embodied as an organic light-emitting element is described by way of example. The present disclosure is not limited thereto.

The organic light-emitting element 260 and the bank layer 270 are formed on the first planarization layer 250. The organic light-emitting element 260 includes a first electrode 261, an organic light-emitting layer 262 and a second electrode 263. The first electrode 261 may act as an anode, while the second electrode 263 may act as a cathode.

The first electrode 261 may be formed on the first planarization layer 250. The first electrode 261 is connected to the source electrode 213 of the thin-film transistor 210 via a contact hole extending through the protective layer 240 and the first planarization layer 250. The first electrode 261 may be made of a metal material with high reflectance. For example, the first electrode 261 may be composed of a stack structure of aluminum and titanium (Ti/Al/Ti), a stack structure of aluminum and ITO (ITO/Al/ITO), an APC alloy, or a stack structure of an APC alloy and ITO (ITO/APC/ITO). In this connection, the APC alloy refers to an alloy of silver (Ag), palladium (Pd), and copper (Cu).

The bank layer 270 may be formed on the first planarization layer 250 so as to cover an edge of the first electrode 261 to partition sub-pixels. That is, the bank layer 270 serves as a pixel defining film that defines the sub-pixels. Specifically, the bank layer 270 may have a plurality of openings OA defined therein. The opening OA may correspond to a light-emitting area EA of the organic light-emitting element 260.

The bank layer 270 may be composed of an organic film made of acrylic resin, epoxy resin, phenolic resin, polyamide resin, or polyimide resin.

The organic light-emitting layer 262 is formed on the first electrode 261 and the bank layer 270. The organic light-emitting layer 262 may include a hole transporting layer, a hole transporting layer, at least one light-emitting layer, and an electron transporting layer. In this case, when the voltage is applied across the first electrode 261 and the second electrode 263, holes and electrons move to the light-emitting layer via the hole transport layer and the electron transport layer, respectively, and are then combined with each other in the light-emitting layer to emit light.

The organic light-emitting layer 262 may be embodied as a white light-emitting layer that emits white light. The organic light-emitting layer 262 may be formed to cover the first electrode 261 and the bank layer 270. The color filter layer 370 including a red color filter, a green color filter, and a blue color filter may be formed on the organic light-emitting element 260 so that the display device 100 may implement various colors.

The second electrode 263 is formed on the organic light-emitting layer 262. When the display device 100 has a top emission structure, the second electrode 263 may be made of a transparent conductive material (TCO) such as ITO or IZO that may transmit light therethrough, or a semi-transmissive conductive material such as magnesium (Mg), silver (Ag), or an alloy of magnesium (Mg) and silver (Ag).

On the organic light-emitting element layer, the encapsulation layer 280 is formed, which extends to the display area DA of the first substrate 111 as well as the non-display area thereof NDA to cover the plurality of light-emitting elements.

The encapsulation layer 280 serves to prevent the penetration of oxygen or moisture into the organic light-emitting layer 262 and the second electrode 263. To this end, the encapsulation layer 280 may include at least one inorganic film and at least one organic film. For example, the encapsulation layer 280 may include a first inorganic encapsulation film 281, an organic encapsulation film 282, and a second inorganic encapsulation film 283.

The first inorganic encapsulation film 281 may be disposed on the second electrode 263. The first inorganic encapsulation film 281 may be formed to cover the second electrode 263. The organic encapsulation film 282 may be disposed on the first inorganic encapsulation film 281. The organic encapsulation film 282 may be formed to have a sufficient thickness to prevent foreign particles from invading through the first inorganic encapsulation film 281 into the organic light-emitting layer 262 and second electrode 263. The second inorganic encapsulation film 283 may be disposed on the organic encapsulation film 282. The second inorganic encapsulation film 283 may be formed to cover the organic encapsulation film 282.

Each of the first and second inorganic encapsulation films 281 and 283 may be made of silicon nitride, aluminum nitride, zirconium nitride, titanium nitride, hafnium nitride, tantalum nitride, silicon oxide, aluminum oxide, or titanium oxide.

The organic encapsulation film 282 may include acrylic resin, or epoxy resin.

The display device 100 may include the dam DAM in a form of a closed curve disposed in the non-display area NDA to surround the organic encapsulation film 282. The dam DAM is formed to surround an outer edge of the display area DA to block flow of the organic encapsulation film 282 constituting the encapsulation layer 280. Thus, the dam DAM may prevent the organic encapsulation film 282 from being exposed to the outside of the display device 100 or invading the pad area PA.

Figure 6:
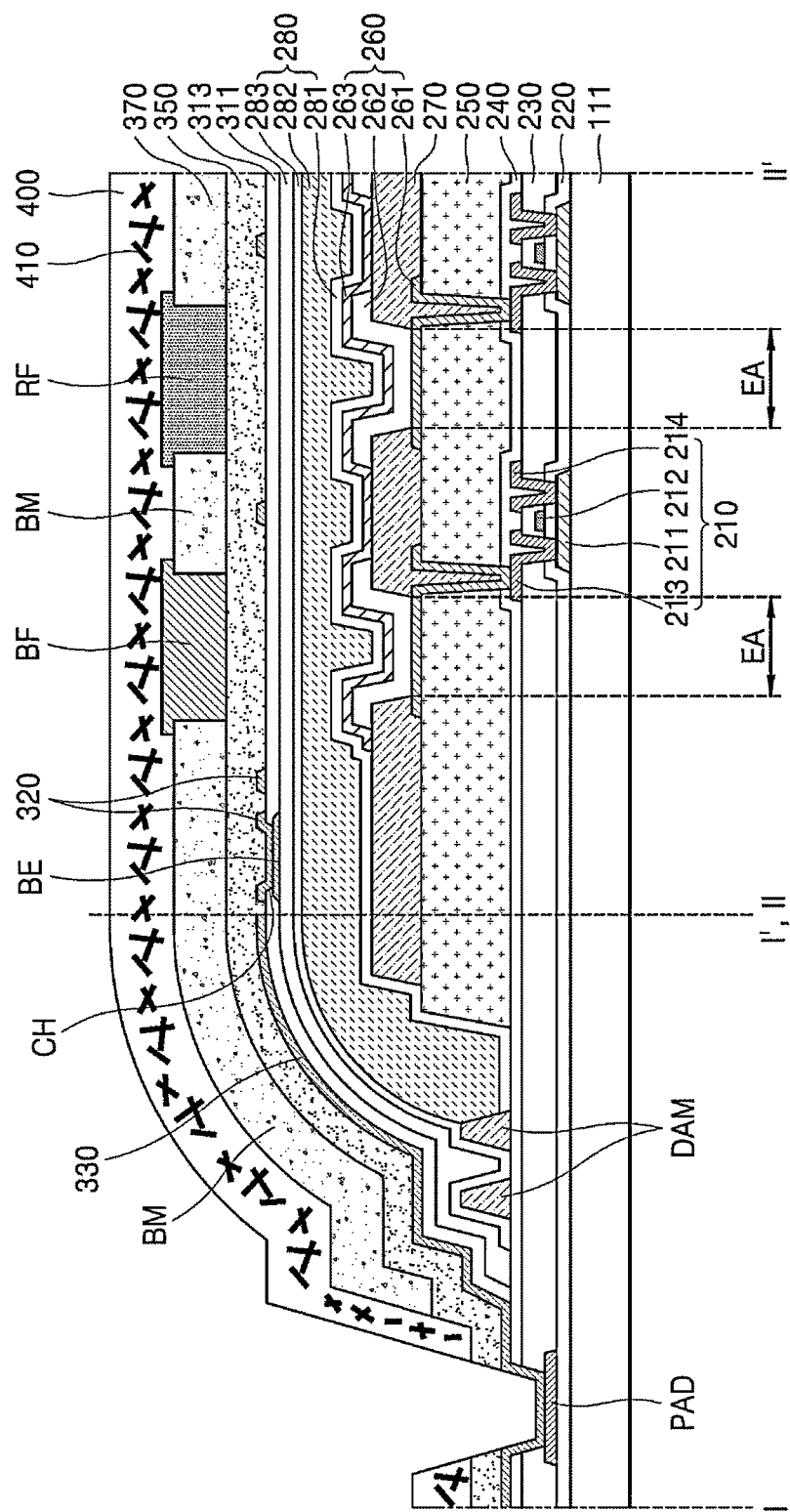
FIG. 6 is a cross-sectional view of one embodiment of I-I' and II-II' of FIG. 4.
Figure 7:
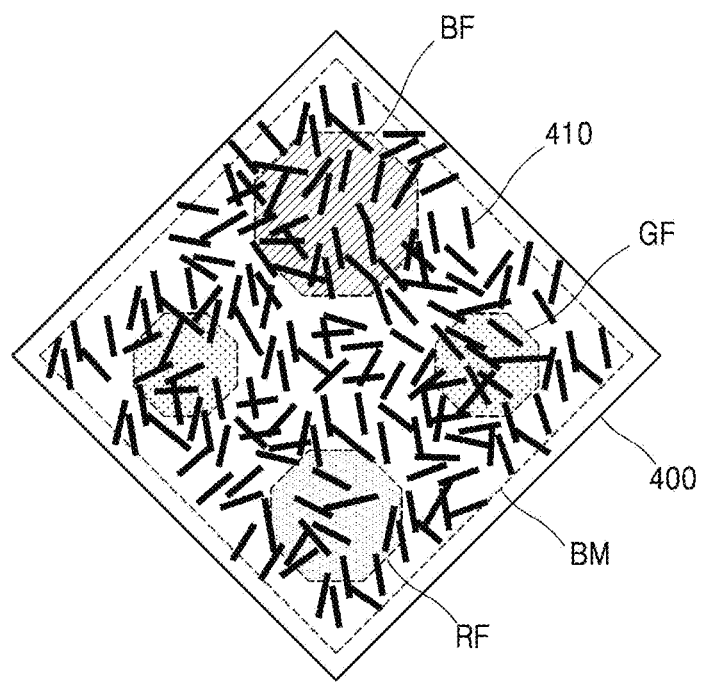
FIG. 7 is a plan view of a single pixel according to one embodiment of the present disclosure.

The dam DAM may include a single dam. However, the present disclosure is not limited thereto. When forming a plurality of dams DAMs, the flow of the organic encapsulation film 282 may be more effectively blocked. In the present disclosure, as shown in FIG. 6, two dams DAMs are formed. The present disclosure is not limited thereto.

This dam DAM may be formed simultaneously with the first planarization layer 250 or the bank layer 270, and may be made of a material such as that of the first planarization layer 250 or the bank layer 270.

The second inorganic encapsulation film 283 may be formed to cover the dam DAM.

The touch sensing layer is formed on the encapsulation layer 280. The touch sensing layer may include touch electrodes 320 including first touch electrodes TE and second touch electrodes RE, bridge electrodes BE, a touch buffer layer 311, and an insulating layer 313.

First, the touch buffer layer 311 may be formed on the encapsulation layer 280 in the display area DA and the non-display area NDA, and may be formed such that the pad PAD is exposed in the non-display area NDA. The touch buffer layer 311 may be formed to cover the dam DAM.

The touch buffer layer 311 prevents foreign substances such as chemical solutions such as a development solution or an etching solution used in the manufacturing process of the touch electrodes formed on the touch buffer layer 311 or external moisture from penetrating into the organic light-emitting element 260 including an organic material.

The bridge electrodes BE are formed on the touch buffer layer 311. The bridge electrodes BE are formed in the display area DA. The first touch electrodes TE formed on the insulating layer 313 may be electrically connected to each other via the bridge electrodes BE.

Figure 4:
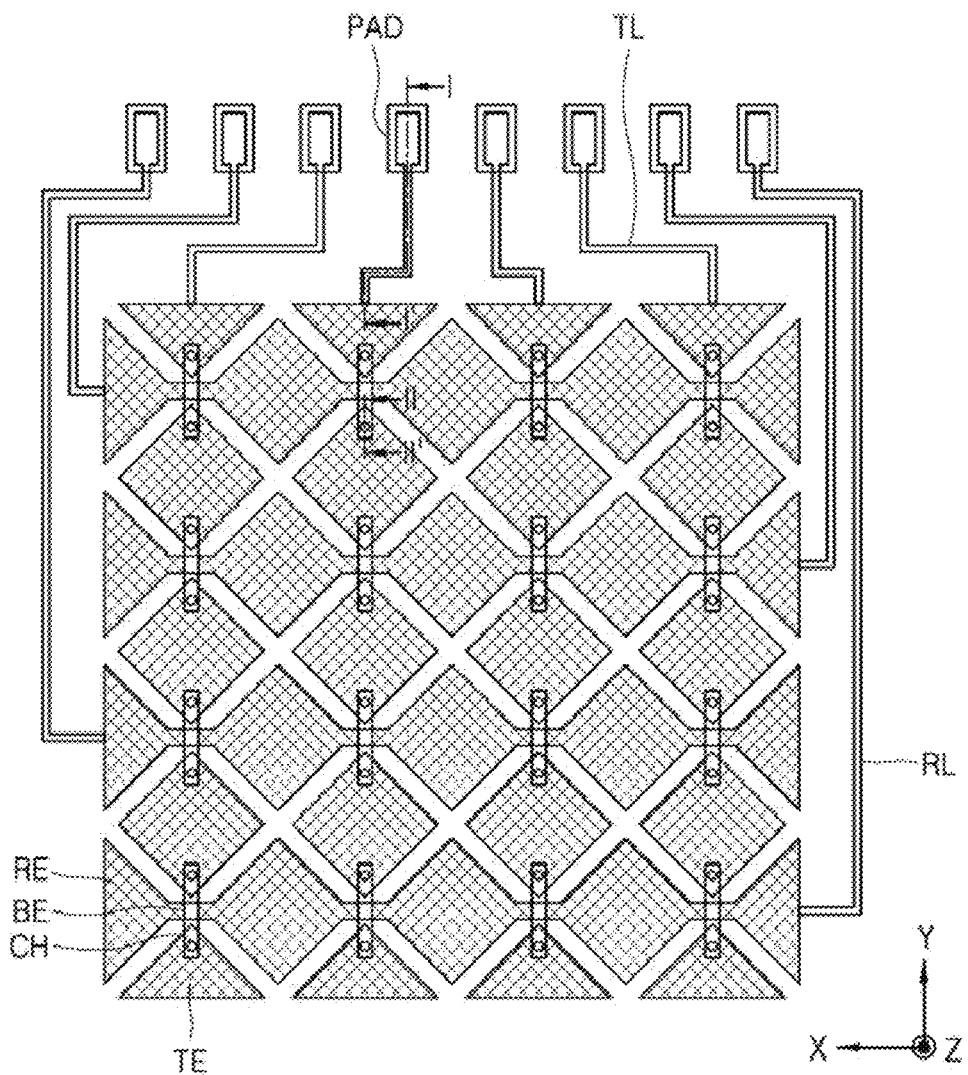
FIG. 4 is a plan view of an example of a touch sensing layer disposed on a first substrate according to one embodiment of the present disclosure.

In order to prevent the first touch electrode TE and the second touch electrode RE from being short-circuited with each other in a crossing area therebetween, the first touch electrodes TE adjacent to each other in a first direction (y axis direction) as shown in FIG. 4 may be electrically connected to each other via the bridge electrode BE. The bridge electrode BE may be disposed in a layer different from a layer in which the first and second touch electrodes TE and RE are formed. The bridge electrode BE may be connected to mutually adjacent first touch electrodes TE via a contact hole CH. The bridge electrode BE may intersect with the second touch electrode RE.

In this case, the contact holes CH may extend through the insulating layer 313. The bridge electrode BE may be disposed under the insulating layer 313 and may be exposed through two contact holes. Accordingly, the bridge electrode BE may be connected to the adjacent two first touch electrodes TE.

The insulating layer 313 may be formed on the touch buffer layer 311 to cover the bridge electrodes BE, so that the bridge electrodes BE and the second touch electrodes RE may be insulated from each other. Further, the insulating layer 313 may be disposed between the bridge electrodes BE to insulate the bridge electrodes BE from each other.

The insulating layer 313 may extend not only to the display area DA but also to the non-display area NDA. The insulating layer 313 may be formed to cover the dam DAM area, so that a step caused by the dam DAM may be reduced.

The plurality of touch electrodes 320 having a mesh shape are formed on the insulating layer 313. The touch electrodes 320 include first touch electrodes TE and second touch electrodes RE.

The first touch electrodes TE and the second touch electrodes RE are formed in the display area DA. The first touch electrodes TE may be connected to each other in the first direction (y axis direction), while the second touch electrodes RE may be connected to each other in the second direction (x axis direction). In this connection, the first direction (y axis direction) may be parallel to the scan lines S1 to Sn, while the second direction (x axis direction) may be parallel to the data lines D1 to Dm. Alternatively, the first direction (y axis direction) may be parallel to the data lines D1 to Dm, while the second direction (x axis direction) may be parallel to the scan lines S1 to Sn.

Each of the first touch electrodes TE connected to each other in the first direction (y axis direction) may be electrically insulated from the first touch electrodes TE adjacent thereto in the second direction (x axis direction). Each of the second touch electrodes RE connected to each other in the second direction (x axis direction) may be electrically insulated from the second touch electrodes RE adjacent thereto in the first direction (y axis direction).

For this reason, mutual capacitance corresponding to the touch sensor may be generated in a crossing area between the first touch electrode TE and the second touch electrode RE.

Figure 5:
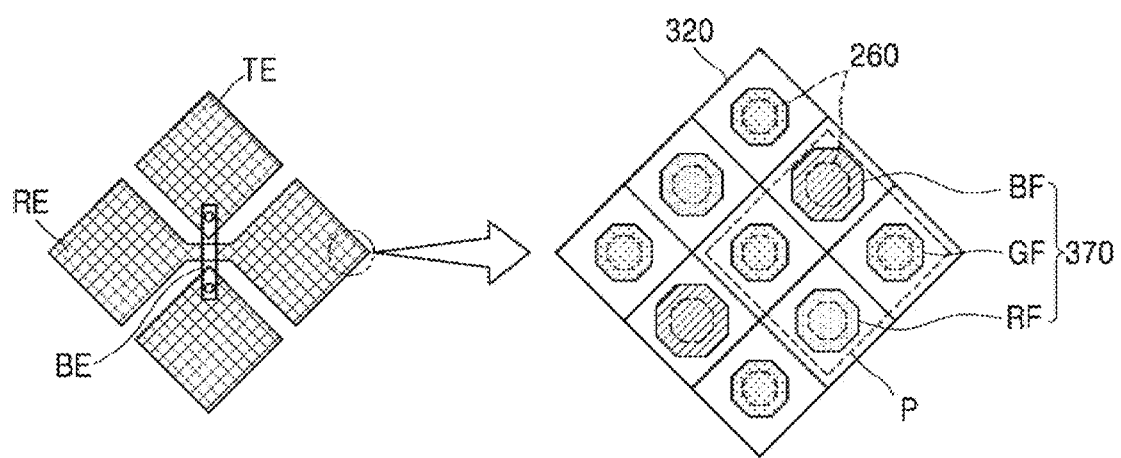
FIG. 5 is an enlarged plan view of a touch electrode according to one embodiment of the present disclosure.

For example, as shown in FIG. 5, the touch electrodes 320 may have a mesh shape to have openings defined therein.

The touch electrode 320 may be formed to have the mesh shape, such that the organic light-emitting elements 260 may correspond to the openings of the touch electrode 320, thereby improving the light emission efficiency.

The touch electrode 320 may be positioned to correspond to the bank layer 270. The bank layer 270 may have a plurality of openings defined therein as described above. The openings correspond to the light-emitting areas EA of the organic light-emitting element 260. Thus, the openings of the touch electrode 320 may be arranged to correspond to the openings of the bank layer 270.

Accordingly, the touch electrode 320 may be disposed along the bank layer 270 so as to correspond to the bank layer 270. As the touch electrode 320 may be positioned to correspond to the bank layer 270, the openings of the touch electrode 320 may also be arranged to correspond to the light-emitting areas EA, so that the openings of the touch electrode 320 overlap the light-emitting areas EA. As a result, it is possible to minimize the decrease in the light emission efficiency.

In one example, the touch pad PAD may be disposed in the non-display area NDA. On the insulating layer 313, a touch routing wire 330 for electrically connecting the touch pad PAD and the touch electrode 320 to each other may be formed.

In this case, the touch pad PAD may be made of the same material on the same layer as the gate electrode 212. The touch routing wire 330 may be made of the same material on the same layer as the touch electrode 320.

On the insulating layer 313, the color buffer layer 350 covering the touch electrode 320 and the touch routing wire 330 is formed.

Further, the color filter layer 370 is formed on the color buffer layer 350. The color filter layer 370 includes a red color filter RF, a green color filter GF, a blue color filter BF, and a black matrix BM that separates the red color filter RF, the green color filter GF, and the blue color filter BF. The black matrix BM may have a plurality of openings defined therein. The red color filter RF, the green color filter GF, and the blue color filter BF may be respectively disposed in the plurality of openings thereof. In one embodiment of the present disclosure, one pixel P may have one red sub-pixel, two green sub-pixels, and one blue sub-pixel. Accordingly, in one embodiment of the present disclosure, one red color filter RF, two green color filters GF, and one blue color filter BF may be disposed in each pixel P.

The red color filter RF, the green color filter GF, and the blue color filter BF may be arranged to respectively correspond to the openings of the touch electrode 320, and correspond to the light-emitting areas EA of the organic light-emitting element 260. The black matrix BM may be positioned to correspond to touch electrode 320, and correspond to the bank layer 270. A width of the black matrix BM may be smaller than a width of the bank layer 270. Therefore, a size of each of the openings of the black matrix BM may be larger than a size of each of the openings of the bank layer 270. The black matrix BM may extend to the non-display area NDA to cover the touch routing wire 330.

On the color filter layer 370, the second planarization layer 400 that may remove a step due to the color filters is formed. The second planarization layer 400 may include a matrix resin, and inorganic nano-tubes 410 irregularly dispersed within the matrix resin. That is, the second planarization layer 400 may be made of the matrix resin containing the inorganic nano-tubes 419 irregularly dispersed therein. The second planarization layer 400 covers the color filter layer 370 over the entire display area DA. The second planarization layer 400 extends to the non-display area NDA to cover the touch routing wire 330. The second planarization layer 400 may cover the black matrix BM on the touch routing wire 330.

The matrix resin may be made of a photosensitive resin, for example, a photosensitive acrylic resin. The matrix resin may be produced from a composition containing an acrylate monomer having an epoxy group, an oxime ester-based photo-initiator, and a solvent. The solvent may include isopropyl alcohol (IPA), acetone, toluene, benzene, chloroform, n-methyl pyrrolidone (NMP), polyethylene glycol (PEG), propylene glycol methyl ether acetate (PGMEA).

The inorganic nano-tube 410 may include a silica nano-tube or a silicon nano-tube. A diameter of the inorganic nano-tube 410 may be in a range of 1 nm to 100 nm. A length of the inorganic nano-tube 410 may be in a range of 200 nm to 1 um.

The second planarization layer 400 may have a thickness of several um, for example, a thickness of 2 um. In this case, when the length of the inorganic nano-tube 410 exceeds 1 um, the nano-tube may protrude upwardly beyond a surface of the second planarization layer 400, such that an even surface may not be obtained. When the length of the inorganic nano-tube 410 is smaller than 200 nm, there is no suppression effect of the rainbow mura defect.

The inorganic nano-tubes 410 may be contained in an amount of 1% to 30% by weight based on a total weight of the second planarization layer 400. When the content of the inorganic nano-tubes 410 in the second planarization layer 400 is lower than 1% by weight, there is no suppressive effect of the rainbow mura defect. When the content of the inorganic nano-tubes 410 in the second planarization layer 400 is higher than 50% by weight, the transmittance of the second planarization layer 400 may be degraded and may not be used for the display device. When the content of the inorganic nano-tubes 410 in the second planarization layer 400 is in a range of 1% to 50% by weight, the rainbow mura defect may be suppressed. However, when the content of the inorganic nano-tubes 410 in the second planarization layer 400 is higher than 30% by weight, haze increases. Therefore, in order to suppress the rainbow mura while not increasing the haze as a side effect, the inorganic nano-tubes 410 may be contained in an amount of 1% to 30% by weight based on the total weight of the second planarization layer 400.

In Table 1 below, a transmittance %, a reflectance %, and a rainbow mura defect according to a comparative example and the embodiment are shown. The comparative example refers to a structure that does not include a planarization layer made of the matrix resin containing inorganic nano-tubes irregularly dispersed therein according to the embodiment of the present disclosure.

TABLE 1

| | Transmittance % | Reflectance % | Rainbow mura |
|---|---|---|---|
| Comparative example | 94 | 8.6 | Strong |
| Embodiment | 97 | 4.9 | Weak |

In the embodiment, the reflectance decreases and the rainbow mura defect is suppressed without the decrease in transmittance, compared to the comparative example.

Figure 10A:
FIGS. 10A and 10B show a result of evaluating a rainbow mura defect in a comparative example and a present example.
Figure 10B:

Referring to FIGS. 10A and 10B, it may be identified that in the embodiment, the rainbow mura is suppressed, compared to the comparative example. FIG. 10A shows an evaluation of the rainbow mura in the comparative example, while FIG. 10B shows an evaluation of the rainbow mura in the embodiment.

In one embodiment of the present disclosure, the second planarization layer 400 containing the inorganic nano-tubes 410 irregularly dispersed therein may be formed on the color filter layer 370. Thus, the rainbow mura defect as caused by diffraction and reflection of the external light due to the color filters, and the diffraction and interference of internal reflected light due to the color filters may be suppressed.

Figure 8:
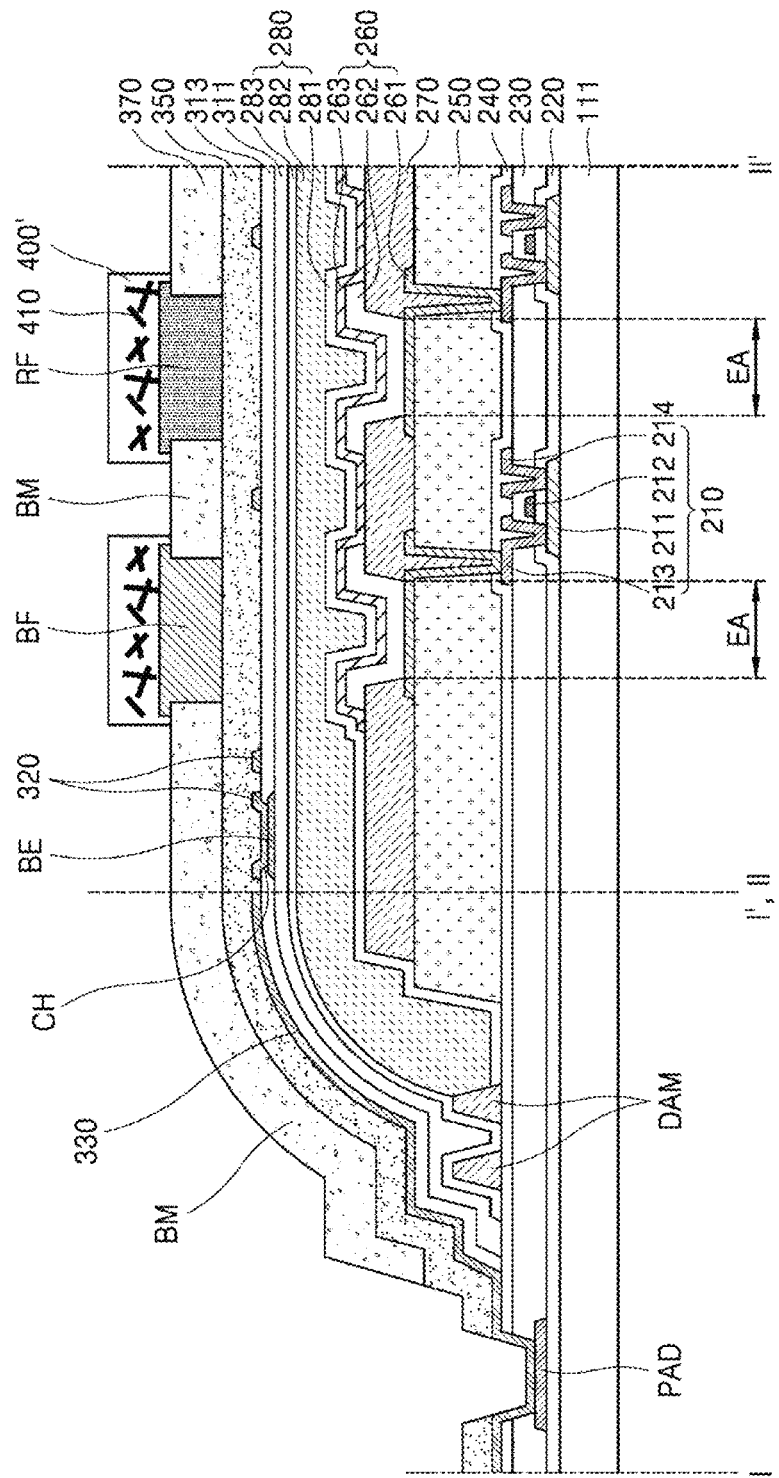
FIG. 8 is a cross-sectional view of a display device according to one embodiment of the present disclosure.
Figure 9:
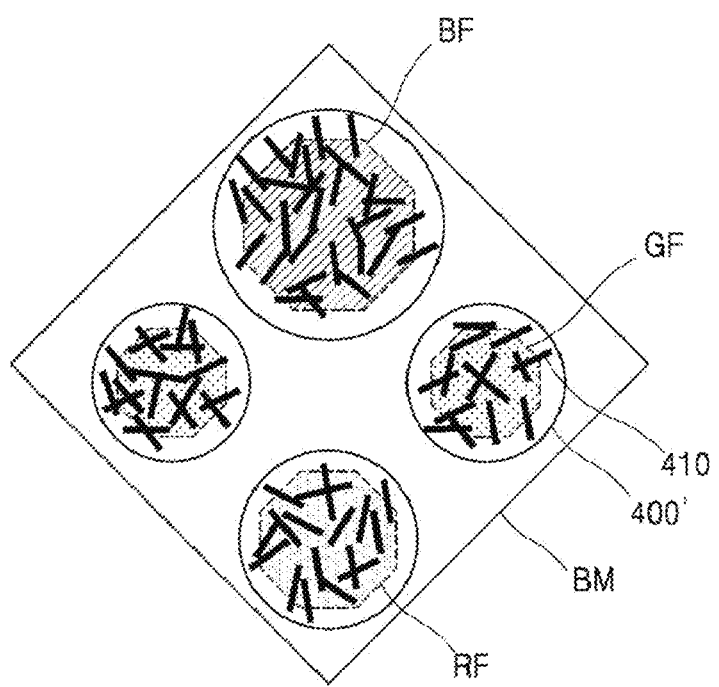
FIG. 9 is a plan view of a single pixel according to one embodiment of the present disclosure.

FIG. 8 is a cross-sectional view of a display device according to another embodiment of the present disclosure. FIG. 9 is a plan view of a single pixel according to another embodiment of the present disclosure.

Hereinafter, the description will be omitted which is related to the content duplicate to that of the display device according to one embodiment of the present disclosure as described above based on FIG. 6. Rather, differences therebetween will be mainly discussed. The description as omitted may refer to the content duplicate to that of the display device according to one embodiment of the present disclosure as described above based on FIG. 6.

The display device according to another embodiment of the present disclosure includes a plurality of second planarization layers 400' which are locally arranged respectively to correspond to a plurality of color filters, that is, red color filters RF, green color filters GF, and blue color filters BF.

The plurality of second planarization layers 400' may be disposed to completely and respectively cover the plurality of color filters, that is, red color filters RF, green color filters GF, and blue color filters BF. A size of each of the plurality of second planarization layers 400' may be larger than a size of each of the plurality of color filters, that is, each red color filter RF, each green color filter GF, and each blue color filter BF.

The plurality of second planarization layers 400' may be arranged to respectively correspond to the plurality of openings of the bank layer 270. A size of each of the plurality of second planarization layers 400' may be larger than a size of each of the plurality of openings of the bank layer 270.

Embodiments of the present disclosure may be described as follows.

A first aspect of the present disclosure provides a display device comprising: a base substrate including a display area and a non-display area; a plurality of organic light-emitting elements disposed in the display area; an encapsulation layer disposed to cover the plurality of organic light-emitting elements; a mesh-shaped touch electrode disposed on the encapsulation layer, wherein the touch electrode has a plurality of openings defined therein; a color filter layer disposed on the touch electrode, wherein the color filter layer includes: a plurality of color filters arranged to respectively correspond to the plurality of openings of the touch electrode; and a black matrix disposed to correspond to the touch electrode; and a planarization layer disposed on the color filter layer, wherein the planarization layer contains a matrix resin, and inorganic nano-tubes irregularly dispersed in the matrix resin.

In one implementation of the first aspect, the inorganic nano-tube includes a silica nano-tube or a silicon nano-tube.

In one implementation of the first aspect, the inorganic nano-tube has a length in a range of 200 nm to 1 um.

In one implementation of the first aspect, the inorganic nano-tube has a diameter in a range of 1 nm to 100 nm.

In one implementation of the first aspect, the inorganic nano-tubes are contained in an amount of 1% to 30% by weight relative to a total weight of the planarization layer.

In one implementation of the first aspect, the matrix resin includes a photosensitive resin.

In one implementation of the first aspect, the device further comprises: a touch pad disposed in the non-display area; and a touch routing wire disposed on the encapsulation layer for electrically connecting the touch pad and the touch electrode to each other, wherein the planarization layer extends into the non-display area and covers the touch routing wire.

In one implementation of the first aspect, the planarization layer includes a plurality of planarization layers locally arranged to respectively correspond to the plurality of color filters.

In one implementation of the first aspect, the plurality of planarization layers are arranged to cover the plurality of color filters, respectively.

In one implementation of the first aspect, the device further comprises a bank layer disposed under the encapsulation layer, wherein the bank layer has a plurality of openings defined therein, wherein the touch electrode is positioned to correspond to the bank layer, wherein the plurality of planarization layers are arranged to respectively correspond to the plurality of openings of the bank layer.

A second aspect of the present disclosure provides a display device comprising: a base substrate including a display area and a non-display area; a bank layer disposed in the display area, wherein the bank layer has a plurality of openings defined therein; a plurality of organic light-emitting elements respectively disposed in the plurality of openings of the bank layer; an encapsulation layer disposed to cover the plurality of organic light-emitting elements; a color filter layer disposed on the encapsulation layer, wherein the color filter layer includes: a plurality of color filters arranged to respectively correspond to the openings of the bank layer; and a black matrix disposed to correspond to the bank layer; and a planarization layer disposed on the color filter layer, wherein the planarization layer contains a matrix resin, and inorganic nano-tubes irregularly dispersed in the matrix resin.

In one implementation of the second aspect, the inorganic nano-tube includes a silica nano-tube or a silicon nano-tube.

In one implementation of the second aspect, the inorganic nano-tube has a length in a range of 200 nm to 1 um.

In one implementation of the second aspect, the inorganic nano-tube has a diameter in a range of 1 nm to 100 nm.

In one implementation of the second aspect, the inorganic nano-tubes are contained in an amount of 1% to 30% by weight relative to a total weight of the planarization layer.

In one implementation of the second aspect, the matrix resin includes a photosensitive resin.

In one implementation of the second aspect, the device further comprises: a mesh-shaped touch electrode disposed in the display area and disposed between the encapsulation layer and the color filter layer; a touch pad disposed in the non-display area; and a touch routing wire disposed on the encapsulation layer for electrically connecting the touch pad and the touch electrode to each other, wherein the planarization layer extends into the non-display area and covers the touch routing wire.

In one implementation of the second aspect, the planarization layer includes a plurality of planarization layers locally arranged to respectively correspond to the plurality of color filters.

In one implementation of the second aspect, the plurality of planarization layers are arranged to cover the plurality of color filters, respectively.

In one implementation of the second aspect, the plurality of planarization layers are arranged respectively to correspond to the plurality of openings of the bank layer.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:
1. A display device comprising:
 a base substrate including a display area and a non-display area;
 a plurality of organic light-emitting elements disposed in the display area;
 an encapsulation layer disposed to cover the plurality of organic light-emitting elements;
 a mesh-shaped touch electrode disposed on the encapsulation layer, wherein the touch electrode has a plurality of openings defined therein;

a color filter layer disposed on the touch electrode, wherein the color filter layer includes:
  a plurality of color filters arranged to respectively correspond to the plurality of openings of the touch electrode; and
  a black matrix disposed to correspond to the touch electrode; and
a planarization layer disposed on the color filter layer, wherein the planarization layer contains a matrix resin, and inorganic nano-tubes irregularly dispersed in the matrix resin.

2. The display device of claim 1, wherein the inorganic nano-tube includes a silica nano-tube or a silicon nano-tube.

3. The display device of claim 1, wherein the inorganic nano-tube has a length in a range of 200 nm to 1 um.

4. The display device of claim 1, wherein the inorganic nano-tube has a diameter in a range of 1 nm to 100 nm.

5. The display device of claim 1, wherein the inorganic nano-tubes are contained in an amount of 1% to 30% by weight relative to a total weight of the planarization layer.

6. The display device of claim 1, wherein the matrix resin includes a photosensitive resin.

7. The display device of claim 1, wherein the device further comprises:
  a touch pad disposed in the non-display area; and
  a touch routing wire disposed on the encapsulation layer for electrically connecting the touch pad and the touch electrode to each other,
  wherein the planarization layer extends into the non-display area and covers the touch routing wire.

8. The display device of claim 1, wherein the planarization layer includes a plurality of planarization layers locally arranged to respectively correspond to the plurality of color filters.

9. The display device of claim 8, wherein the plurality of planarization layers are arranged to cover the plurality of color filters, respectively.

10. The display device of claim 8, wherein the device further comprises a bank layer disposed under the encapsulation layer, wherein the bank layer has a plurality of openings defined therein,
  wherein the touch electrode is positioned to correspond to the bank layer, and
  wherein the plurality of planarization layers are arranged to respectively correspond to the plurality of openings of the bank layer.

11. A display device comprising:
a base substrate including a display area and a non-display area;
a bank layer disposed in the display area, wherein the bank layer has a plurality of openings defined therein;
a plurality of organic light-emitting elements respectively disposed in the plurality of openings of the bank layer;
an encapsulation layer disposed to cover the plurality of organic light-emitting elements;
a color filter layer disposed on the encapsulation layer, wherein the color filter layer includes:
  a plurality of color filters arranged to respectively correspond to the openings of the bank layer; and
  a black matrix disposed to correspond to the bank layer; and
a planarization layer disposed on the color filter layer, wherein the planarization layer contains a matrix resin, and inorganic nano-tubes irregularly dispersed in the matrix resin.

12. The display device of claim 11, wherein the inorganic nano-tube includes a silica nano-tube or a silicon nano-tube.

13. The display device of claim 11, wherein the inorganic nano-tube has a length in a range of 200 nm to 1 um.

14. The display device of claim 11, wherein the inorganic nano-tube has a diameter in a range of 1 nm to 100 nm.

15. The display device of claim 11, wherein the inorganic nano-tubes are contained in an amount of 1% to 30% by weight relative to a total weight of the planarization layer.

16. The display device of claim 11, wherein the matrix resin includes a photosensitive resin.

17. The display device of claim 11, wherein the device further comprises:
  a mesh-shaped touch electrode disposed in the display area and disposed between the encapsulation layer and the color filter layer;
  a touch pad disposed in the non-display area; and
  a touch routing wire disposed on the encapsulation layer for electrically connecting the touch pad and the touch electrode to each other, and
  wherein the planarization layer extends into the non-display area and covers the touch routing wire.

18. The display device of claim 11, wherein the planarization layer includes a plurality of planarization layers locally arranged to respectively correspond to the plurality of color filters.

19. The display device of claim 18, wherein the plurality of planarization layers are arranged to cover the plurality of color filters, respectively.

20. The display device of claim 18, wherein the plurality of planarization layers are arranged respectively to correspond to the plurality of openings of the bank layer.

* * * * *